United States Patent [19]
Maulik et al.

[11] Patent Number: 6,111,529
[45] Date of Patent: Aug. 29, 2000

[54] ACCURATE GAIN CALIBRATION OF ANALOG TO DIGITAL CONVERTERS

[75] Inventors: Prabir C. Maulik; Mandeep Singh Chadha, both of Austin, Tex.

[73] Assignee: Cirrus Logic, Inc., Austin, Tex.

[21] Appl. No.: 09/164,110

[22] Filed: Sep. 30, 1998

[51] Int. Cl.[7] .............................. H03M 1/10; H03M 3/00
[52] U.S. Cl. .......................................... 341/120; 341/143
[58] Field of Search ..................................... 341/120, 143

[56] References Cited

U.S. PATENT DOCUMENTS

| | | | |
|---|---|---|---|
| 4,772,871 | 9/1988 | Suzuki et al. | 341/155 |
| 4,943,807 | 7/1990 | Early et al. | 341/143 |
| 5,654,711 | 8/1997 | Fujimori | 341/143 |
| 5,745,060 | 4/1998 | McCartney et al. | 341/120 |
| 6,005,505 | 12/1999 | Linz | 341/143 |

OTHER PUBLICATIONS

Prabir C. Maulik et al.; "An Analog/Digital Interface for Cellular Telephony"–IEEE Journal of Solid–State Circuits, vol. 30, No. 3, Mar. 1995, pp. 201–209.

David B. Ribner et al.; "A Third–Order Multistage Sigma–Delta Modulator with Reduced Sensitivity to Nonidealities"–IEEE Journal of Solid–State Circuits, vol. 26, No. 12, Dec. 1991, pp. 1764–1773.

D.R. Welland et al.; "A Stereo 16–Bit Delta–Sigma A/D Converter for Digital Audio", Journal of the Audio Engineering Society, vol. 37, Jun. 1989, pp. 476–486.

*Primary Examiner*—Trong Phan
*Attorney, Agent, or Firm*—Peter Rutkowski; J. P. Violette; William W. Kidd

[57] ABSTRACT

A technique for performing gain calibration on an analog-to-digital converter (ADC) in which offset errors are canceled during gain calibration. In an ADC having a differential integrator at the input of a modulator, two calibration measurements are obtained at the output, one based on a calibration input and the second based on the reversal of the input polarity. The two measured outputs are subtracted from each other so that offset errors introduced by the converter during gain calibration are cancelled.

24 Claims, 5 Drawing Sheets

ACCURATE GAIN CALIBRATION OF ANALOG TO DIGITAL CONVERTERS

BACKGROUND OF THE INVENTION

1. Field of the Invention

The present invention relates to the field of mixed signal integrated circuits and, more particularly, to gain calibration of an analog-to-digital converter.

2. Background of the Related Art

The use of analog-to-digital converters (A/D converters or ADCs) to convert analog signals into digital signals is well known in the art. State-of-the-art practice is to fabricate an ADC on a single integrated circuit chip. Generally, an ADC samples an analog signal at a sampling rate which is twice the highest frequency component being sampled. This is known as the Nyquist rate. The sampled signal is processed and converted into a digital format for output from the converter.

Another type of ADC employs an oversampling technique in which the analog input signal is sampled at a much higher rate than the Nyquist rate. The higher sampling rate improves the performance of the ADC for signal conversion and processing. One commonly used oversampling type of ADC uses a delta-sigma ($\Delta\Sigma$) modulator for oversampling the analog input. The oversampled output of the $\Delta\Sigma$ modulator is coupled to a decimator, which employs a low-pass filtering technique to extract the lower frequency components to generate a converted digital output signal at the Nyquist rate.

It is appreciated that ADCs are mixed-signal devices that require fine tuning to produce an accurate digital output for a given analog input. With one-to-one scaling, a full analog positive input signal (peak signal) should generate a full digital output word (highest digital value). The minimum analog input should also have the minimum digital output. It is also desirable for the conversion process or function to have a linear response between the minimum and maximum outputs. However, since perfect converters cannot be fabricated, mainly due to manufacturing imperfections and component mis-match, calibration procedures are typically required in ADCs.

Two common errors in ADCs, including ADCs using a $\Delta\Sigma$ modulator, are offset and gain errors. The offset error (or offset) is the difference in the digital output value from the desired value of zero, when there is zero analog input. The gain error is the difference in the actual digital output value from the desired digital output value, with the offset error compensated. That is, although the offset is zero, the gain error can cause the ADC to produce a digital value which fails to accurately track the analog input. Accordingly, offset and gain calibration are used to adjust the offset and gain errors inherent in the ADC.

Typically, offset calibration is performed first. With zero analog input, the digital output (referred to as the offset value) is noted and retained. Subsequently, when digital outputs are obtained during normal ADC operations, the offset ($D_{OFFSET}$) value is subtracted from the actual measured digital output to obtain the correct digital value. Then, gain calibration is utilized to adjust the gain so that a proper gain response is obtained in the ADC. Typically, for gain calibration, a known voltage value is input to the ADC and the actual measured digital output value is compared to the value which should be generated for the known input, after subtracting the offset. A known calibration voltage or a reference voltage is utilized at the input. Thus, if an analog full-scale ($A_{FS}$) value is input, then the expected value would be a digital full-scale ($D_{FS}$) value. If the measured digital value with $A_{FS}$ as input is defined as $D_{MEAS}$, then the gain error is defined as $((D_{MEAS}-D_{OFFSET})/D_{FS})-1$, where $D_{OFFSET}$ is the previously measured offset error. Subsequently during normal operations, the digital output value is scaled by the factor $D_{FS}/D_{MEAS}$ to provide the correct gain, after first correcting the offset.

The present invention describes a technique of performing gain calibration on an ADC having a differential input, in which offset shift introduced by a common mode variation is nullified.

SUMMARY OF THE INVENTION

The present invention describes a technique for performing gain calibration in which offset errors are canceled during gain calibration. A calibration voltage is applied to a differential stage in order to measure a first digital value (D1) at the output. Then, the application of the calibration voltage at the input is reversed in polarity to measure a second digital value (D2) at the output. The two outputs are subtracted, one from the other, to obtain a difference value. Since any offset errors present are subtracted from each other, the offset values are nullified for performing the gain calibration. The difference value is then used to obtain a gain scaling factor.

In practicing the invention, an analog-to-digital converter (ADC), having a differential modulator stage to sample an analog input and to convert the analog input to a corresponding digital output, employs the technique of the invention for gain calibration. The gain calibration cancels the offset error which may result during gain calibration. Since the offset error is nullified, accurate gain calibration can be performed using single-ended voltage references for a differential ADC.

DETAILED DESCRIPTION OF THE INVENTION

Figure 1:
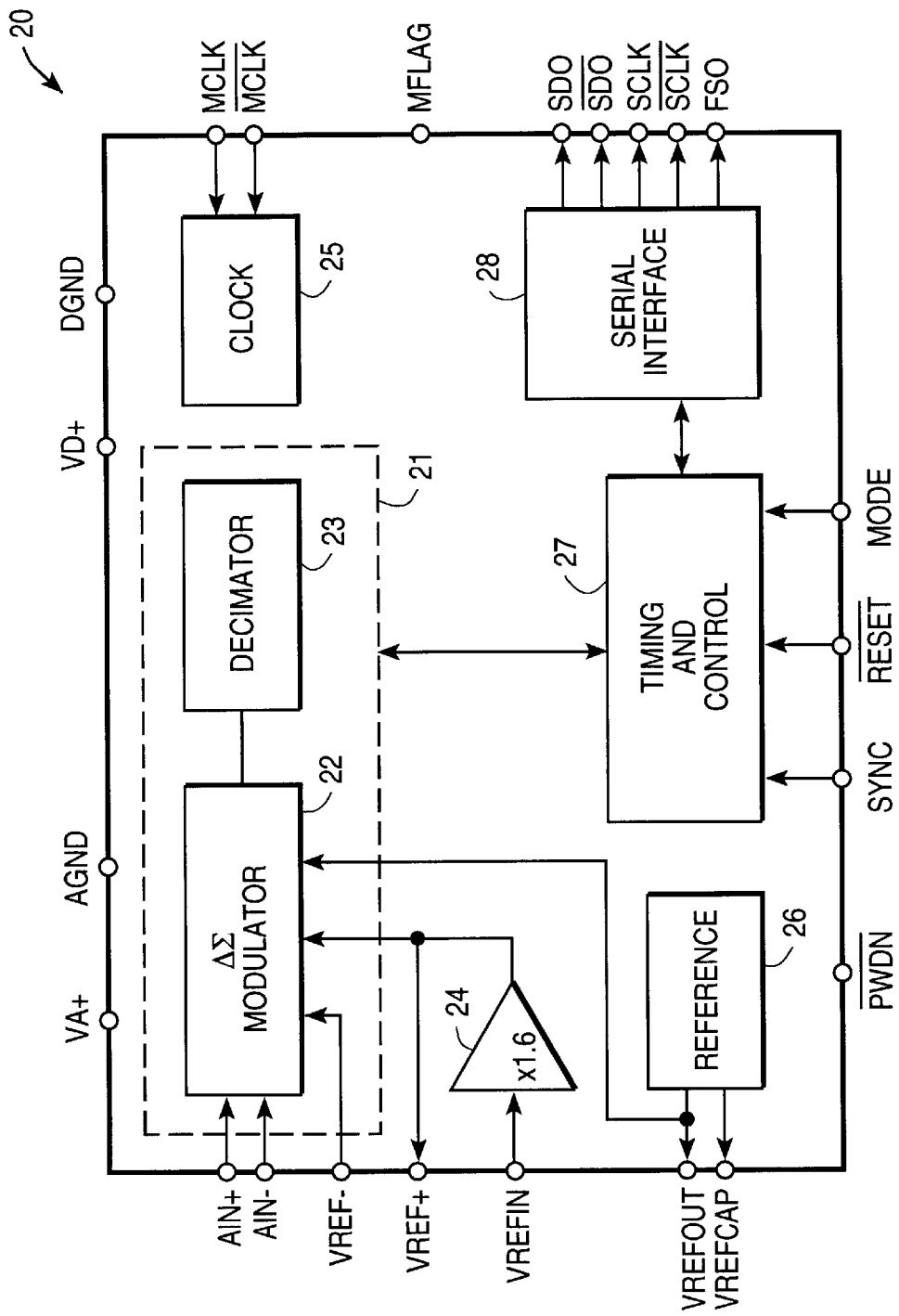
FIG. 1 is a system level block diagram of an oversampling type analog-to-digital converter using a delta-sigma modulator and in which the present invention is utilized to obtain accurate gain calibration for the converter.

Referring to FIG. 1, it shows a fully differential analog-to-digital converter (A/D converter or ADC ) 20 which implements the present invention. ADC 20 is fabricated on a single integrated circuit chip and in the particular embodiment is a monolithic complementary metal-oxide-semiconductor (CMOS) device designed to operate in continuous mode after being reset. However, it is understood that the ADC can be fabricated as a multiple-chip device or using other semiconductor process technology. Furthermore, although the invention is described in reference to an ADC which uses a delta-sigma modulator, it can be practiced in other circuitry as well.

The ADC 20 utilizes a delta-sigma ($\Delta\Sigma$) modulator 22 at the front end of the conversion section 21, while a decimator 23 provides the decimation and filter function at the back end. An analog signal to the ADC 20 is input into the AIN+ and AIN− pins as a fully differential signal with peak-to-peak amplitude of VREFIN×1.6V. Reference voltage VREFIN is multiplied by 1.6 by buffer 24 to provide this reference. The input signal common mode voltage is in a range of 1 to VREFIN volts.

The clocking for the ADC is provided by a clock circuit 25. The ADC 20 is driven from a CMOS-compatible clock at its MCLK pin. The required MCLK is 64×OWR (output word rate). The ADC 20 can be operated with MCLK frequencies from 512 KHz up to 26 MHz. The output word rate scales with the MCLK rate with OWR=MCLK/64. A second clock input pin, MCLK# (# is used herein to designate a complement or a low activation state of a signal) allows the user to run a fully differential clock to the ADC 20 to minimize radiated noise from the printed circuit board layout.

The ADC 20 can be configured to operate from either its internal voltage reference 26 or from an external voltage reference. The on-chip voltage reference is 2.375 volts and is referenced to the analog ground, AGND, pin. The 2.375 volt reference is output from the VREFOUT pin, filtered and returned to the VREFIN pin. The buffer 24 has a gain of 1.6 to generate the reference signal to the $\Delta\Sigma$ modulator 22. Alternatively, the ADC 20 can be configured to use an external voltage reference. The voltage reference is utilized to provide the calibration voltage for calibrating the ADC 20. The voltage reference noted as VREF+ and VREF− is a fully differential voltage.

A timing and control circuit 27 provides the necessary controls for the ADC 20 and to output the conversion words from a serial interface 28. The output from the interface 28 is a synchronous self-clocking format, which includes SDO (serial data output) and its complement SDO#, serial clock SCLK and its complement SCLK#, and FSO (frame synchronization output). FSO falls at the beginning of an output word. Data is output in two's complement format, most significant bit first. FSO stays low for 16 SCLK cycles and the SCLK output is at a rate equal to MCLK/3.

Additionally, RESET# pin is provided for resetting the ADC 20, such as at power up. A PWDN# pin allows for activation of a reduced power consumption mode. A MFLAG pin is provided for a flag signal which indicates when the ADC 20 has become unstable. A MODE pin allows for operation of the ADC 20 in normal mode of operation or in modulator only mode. In normal mode, ADC 20 utilizes the digital decimator 23. In the modulator only mode, the decimation filter and the calibration circuitry in the ADC 20 are turned off and the ADC 20 outputs the 1-bit value from the modulator output. A SYNC input is provided to restart the digital filter at the beginning of its convolution cycle, in which the filters of multiple converters in the system are synchronized.

It is appreciated that the operation of ADC 20 and its components are described for understanding the environment in which the present invention is implemented. The present invention can be implemented in a variety of ADCs, and not necessarily converters using $\Delta\Sigma$ modulators. Furthermore, the present invention can be readily adapted to other data converter circuitry, which utilize differential amplifiers.

When gain calibration is performed on an ADC utilizing an oversampling type modulator, such as the $\Delta\Sigma$ modulator, a known calibration voltage is input to the ADC. After accounting for the offset, the ratio of the actual digital output value to the expected output value provides the scale factor for adjusting the gain. Then, during normal operation, the input signal is scaled using the scale factor to arrive at the correct output value. Performing the gain calibration for single-ended converters is fairly standard. However, in fully differential converters, the calibration procedures are complicated, since single-ended calibration procedures can introduce noticeable error. In the differential ADC 20, the input to the integrator stage is differential, as well as the output. It is appreciated that differential amplifiers provide improved noise immunity over single-ended systems, but introduce common mode related problems.

In the differential system, it is desirable for the system to have very high common mode rejection so that the system will respond similarly at various common mode voltages. In actual practice, most systems will have less than perfect common mode rejection. Accordingly, the system will respond differently depending on the common mode voltage.

In terms of calibration of an ADC utilizing a differential amplifier in the modulator stage (such as the ADC 20), it is simple to ensure that the offset calibration is not impacted by the common mode. Both the positive (+) and negative (−) inputs are coupled to the same reference during offset calibration. If this reference is also used as the input common mode, the calibration common mode value is essentially the common mode value of the device under normal operation.

However, during gain calibration, the common mode may vary from the actual common mode value during normal operation. This is because ADCs commonly use a single-ended reference. One approach to overcoming the shift in the common mode voltage value between offset calibration and gain calibration would be to use a fully differential calibration source. In this manner, the gain calibration common mode voltage can be made the same as the offset calibration common mode voltage. The + and − calibration voltages can be input differentially so that the common mode is made zero. This technique requires the use of two reference voltages for calibration (VREF+ and VREF−, where VREF− is not ground) to obtain the correct common mode voltage employed by the circuit under normal operation of the converter. This approach requires the use of a fully differential source for performing the gain calibration, not just a single-ended source.

Although fully-differential sources could be used, this approach would require additional components which will need to be closely matched to ensure the correct common mode voltage required for gain calibration. If a single-ended voltage reference source (which is typically present on an ADC) is used, it means that VREF− is coupled as common or ground. When this single-ended reference is used for gain calibration, the degree of common mode variation between calibration and normal operation will depend on the quality of the common mode rejection for the device. This variation is reflected in the shifting of the offset error as the common mode voltage changes. That is, the offset with the inputs coupled together and connected to the reference may not be the actual offset value when gain calibration is performed using a single-ended reference source. The actual offset at the calibration common mode value could be different than the offset obtained during offset calibration, therein rendering the offset calibration value obtained prior to the gain calibration inaccurate, so far as gain calibration is concerned.

Figure 2A:
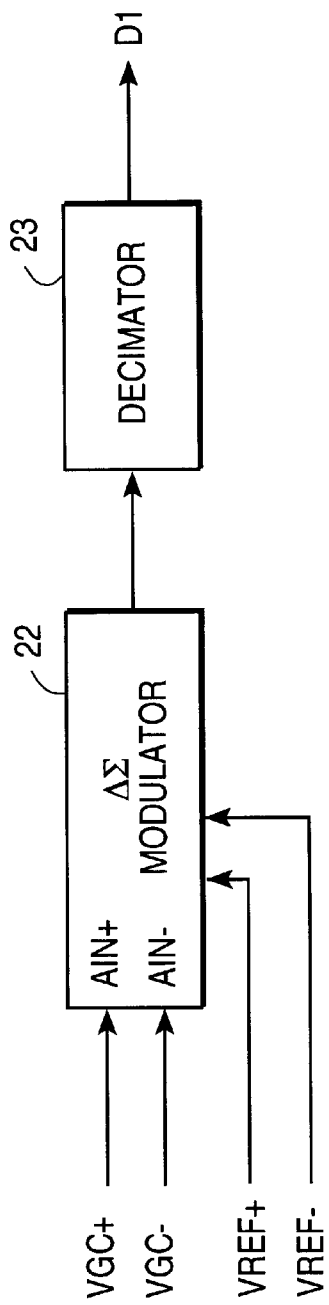
FIG. 2A illustrates the first measurement of the present invention in which a calibration voltage is input at the input of the modulator to obtain a first digital value D1 at the output of the decimator.
Figure 2B:
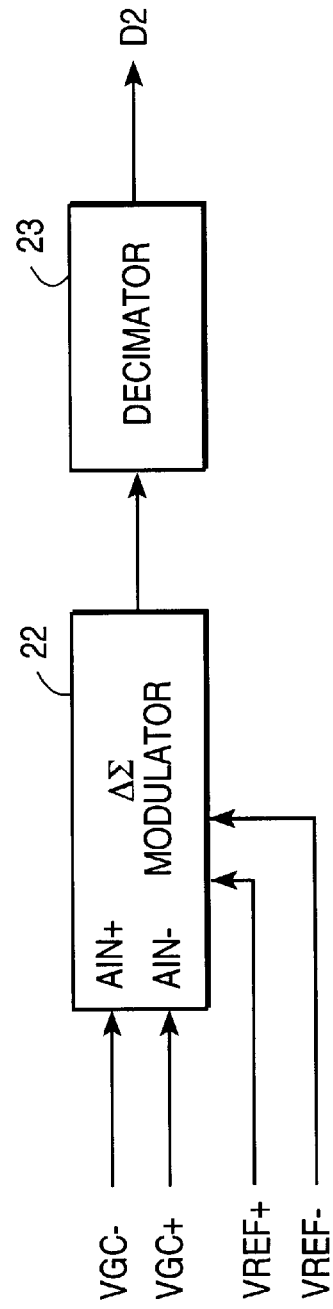
FIG. 2B illustrates the second measurement of the present invention in which a calibration voltage of FIG. 2A is reversed in polarity at the input of the modulator to obtain a second digital value D2 at the output of the decimator.

Referring to FIGS. 2A and 2B, the technique of the present invention for performing accurate gain calibration is illustrated. In order to perform the gain calibration by the technique of the present invention, two calibration measurements are required. The first measurement technique is shown in FIG. 2A and the second measurement technique is shown in FIG. 2B. It is appreciated that either measurement can be performed first. It is also appreciated that, because the offset error is nullified during gain calibration, gain calibration can be performed either before or after offset calibration. In the preferred technique gain calibration is performed first.

In FIG. 2A, a gain calibration voltage (VGC+) and its return (VGC−) are coupled as the input to the ΔΣ modulator 22. The ΔΣ modulator 22 output is then coupled to the decimator 23, whose output is shown as D1 for the first measurement. In the first measurement VGC+ is coupled to the AIN+ input and VGC− is coupled to the AIN− input.

With a known calibration voltage input, the gain calibration output D1 should have the same expected value that corresponds to the input voltage, if there are no errors in the system. However, gain and offset errors will cause the gain calibration output D1 to vary from the desired value, such that D1=S1+VO1, where VO1 is the offset error and S1 is a gain scaled value (when the offset error is subtracted).

It is appreciated that if the offset values remained constant, the offset error value VO1 is equal to the offset voltage (VOFFSET) measured during offset calibration. In that instance, the VOFFSET value measured during offset calibration can be subtracted from D1 to obtain the value S1, which can be used to determine the gain error and the gain scaling needed to correct for the gain error. However, because the modulator utilizes differential amplifiers, VO1 may not be to equal to VOFFSET, if the common mode voltages do not remain the same. In order to ensure a consistent common mode voltage throughout, two reference voltages are needed at the modulator input for performing the gain calibration, as earlier described. The two reference voltages are used to ensure that the common mode voltage for gain calibration is the same common mode voltage obtained during normal operation of the ADC.

The present invention requires only one voltage source for use in performing the gain calibration. The D1 output is obtained by coupling the one calibration voltage source to the input pins AIN+ and AIN− of the modulator 22. Although other sources can be utilized to provide the voltage VGC+ (and its return VGC−), the preferred technique is to use the reference voltage VREF+. Thus, in the preferred embodiment, VGC+=VREF+ and VREF+ is coupled to AIN+ for the first measurement. The return, VGC−=VREF−, which is ground in this instance, is coupled to AIN−. Accordingly, this first measurement is essentially a single-ended measurement.

After obtaining the D1 output, the second measurement is made. The second gain calibration measurement is obtained utilizing the configuration shown in FIG. 2B. The circuit configuration is the same as that of FIG. 2A, except that the VGC+ and VGC− inputs are now reversed. The gain calibration output D2 of the decimator is D2=S2+VO2, where S2 is the gain scaled value and VO2 is the offset error during the second measurement. The second measurement is identical to the first, except that the input signal polarity is reversed. In the particular example, ground is coupled to AIN+ and VREF+ to AIN− of modulator 22.

It is appreciated that the common mode voltage (ACM) for the calibration measurements are the same, since ACM is determined by:

$$ACM=((AIN+)+(AIN-))/2=VREF+/2,$$

when VREF− is ground potential.

Furthermore, VO1=VO2, since the circuit configuration has not changed, except for the change in polarity. Also, because the one input is the negative of the other, it follows that S1=−S2. Accordingly, when subtracting D2 from D1, it follows that:

$$D1-D2=(S1+VO1)-(S2+VO2),$$

since VO1=VO2, $$D1-D2=(S1+VO1-S2-VO1),$$

so that $$D1-D2=S1-S2,$$

but since S1=−S2, $$D1-D2=2S1,$$

or the gain scaling factor S=(D1−D2)/2.

As shown by the equations above, the gain scaling error can be computed by subtracting one gain calibration output from the other and dividing the result by 2. By subtracting D2 from D1, the offset error of the measurements are removed completely. This is made possible since the common mode voltages of the two measurements are the same. This means that the gain scaling factor is obtained without having to consider the value of the common mode voltage and the offset error. Thus, the present invention allows gain calibration to be achieved without the need to compensate for the offset error and the common mode voltage during gain calibration need not be the same common mode voltage present under normal converter operation.

Figure 3:
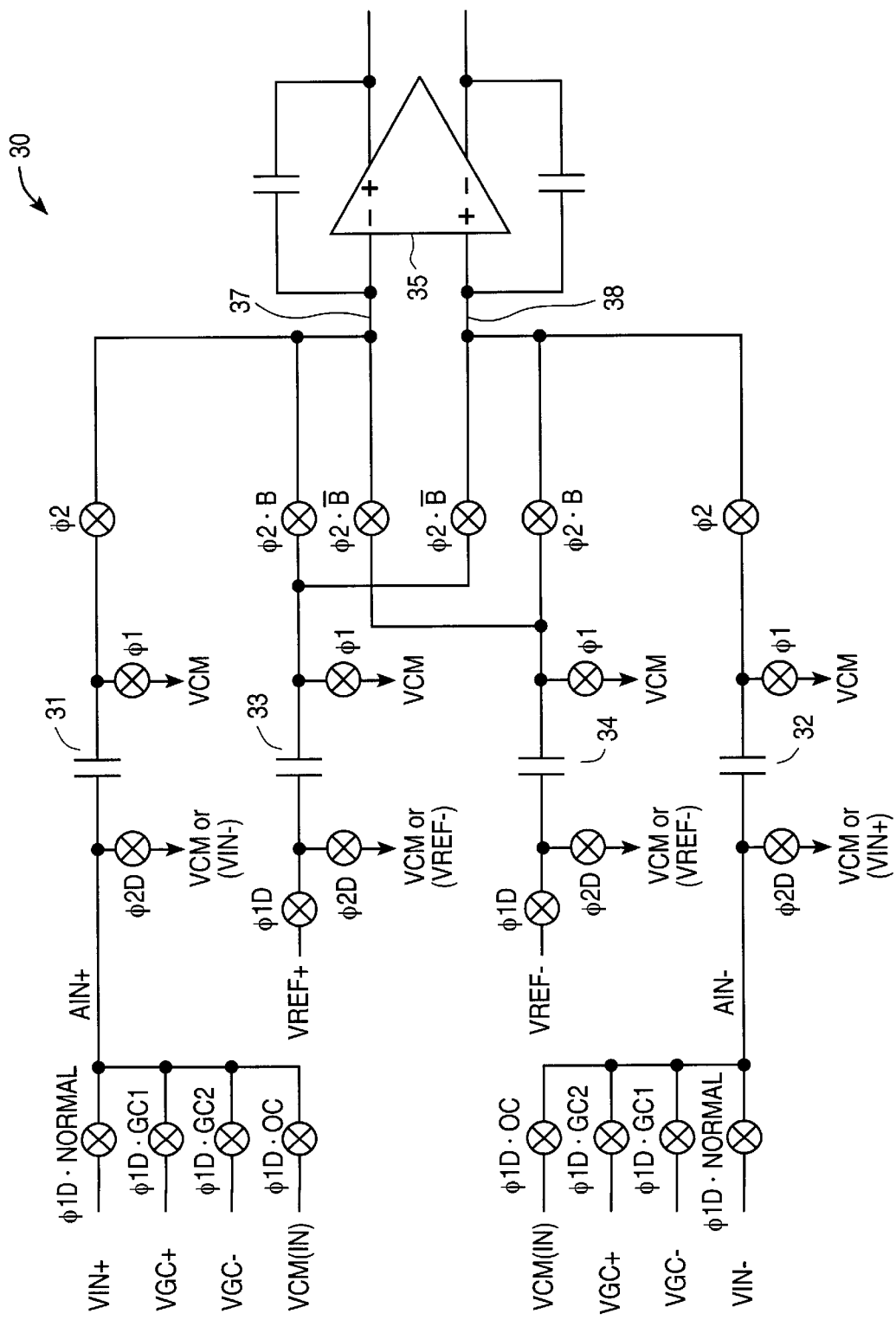
FIG. 3 shows a differential integrator and two pairs of switched capacitor circuitry to illustrate one circuit implementation of applying and switching the calibration voltages to the input integrator stage.
Figure 4:
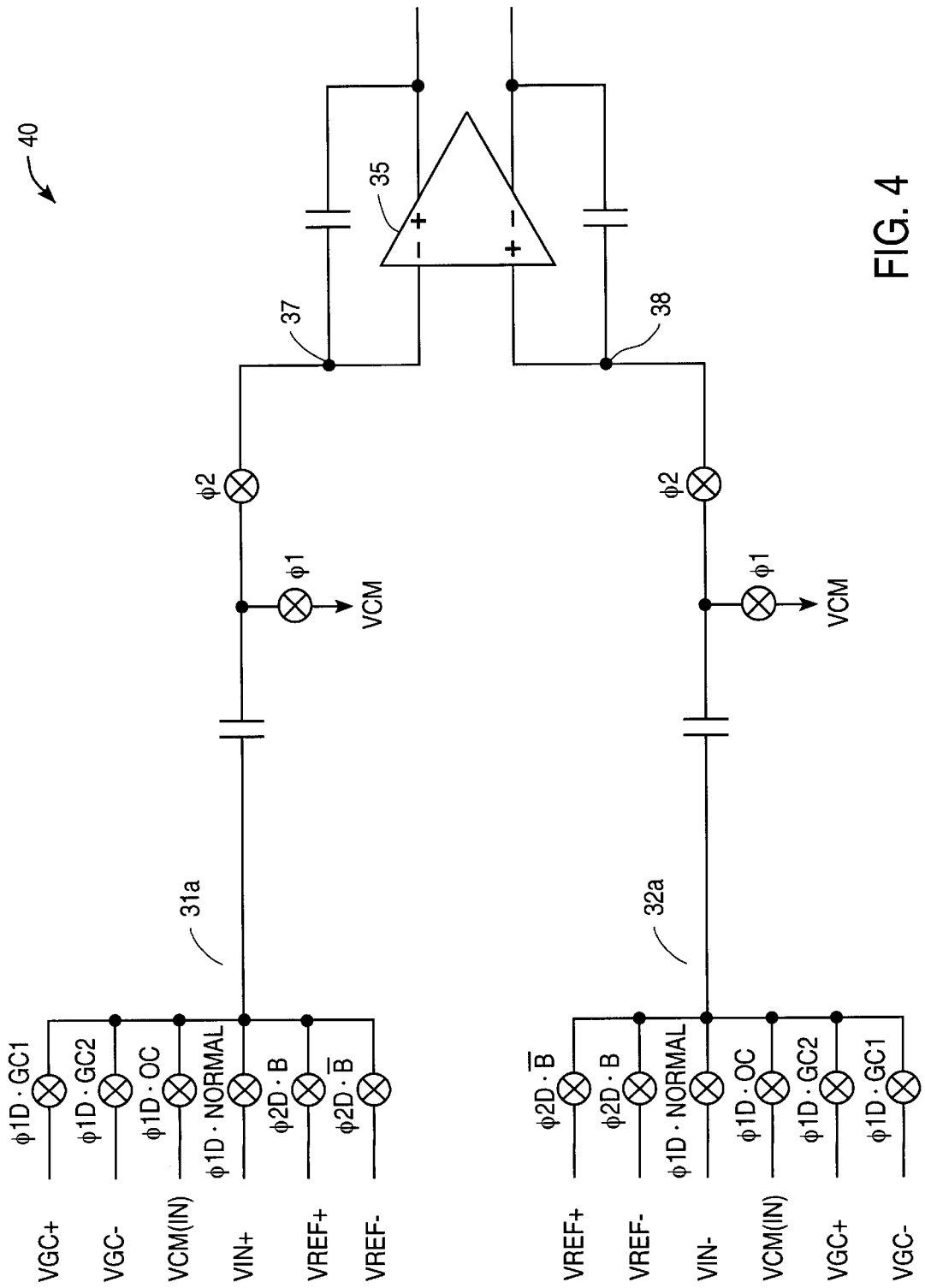
FIG. 4 shows an alternative circuit configuration of FIG. 3, in which the differential integrator is utilized with only one pair of switched capacitor circuitry at the input for applying and switching the calibration voltages to the input integrator stage.

With the technique described above, the present invention can be implemented in a variety of ways. FIGS. 3 and 4 show two preferred techniques for performing the gain calibration in an ADC, such as the ΔΣ modulator ADC 20 shown in FIG. 1.

In FIG. 3, a fully differential input integrator stage 30 to the ΔΣ modulator 22 is shown. The input sampling is provided by the action of switched capacitor circuitry 31 at the AIN+ input and circuitry 32 at the AIN− input. Switched capacitor circuitry 33 and 34 provide the sampling of the VREF+ and VREF− feedback as well. AIN+ and AIN− are coupled through their respective switched capacitor circuitry 31, 32 to their respective summation nodes 37,38 at the input of an integrator 35. VREF+ and VREF− (which in this instance is ground) are coupled through their respective switched capacitor circuitry 33, 34 to one or the other of the nodes 37,38, depending on the state of the feedback bit. The feedback from the output stage of the ΔΣ modulator 22 determines the bit state (shown as B or B#), which controls the switches for directing VREF+ and VREF− coupling to the nodes 37, 38 at the input of the integrator 35. As shown in the example, when the bit state is B, VREF+ is sampled into the negative input terminal of the integrator 35 and VREF− is sampled into the positive input terminal of the integrator 35. When the bit state is B#, the coupling is reversed.

In order to couple the correct inputs as the AIN+ and AIN− inputs to the modulator, a number of parallel switches are positioned for use as the serial input switches of the switched capacitor circuitry 31 and 32. Thus, during normal operation, analog signals are coupled to the stage 30 through inputs shown as VIN+ and VIN−. VIN+ and VIN− are coupled through switches shown having the activation logic, phase 1D×NORMAL ($\phi$1D·NORMAL).

When offset calibration is to be performed, the inputs shown as VCM(IN) are coupled through switches having the activation logic $\phi$1D·OC. That is, the common mode voltage VCM(IN) of the circuit under normal operation is coupled to both inputs of the integrator 35 to perform the offset calibration. It is appreciated that although offset compensation is not needed for the gain calibration of the invention, the offset error correction is still needed for the analog input signals during normal operation of the modulator.

The first gain calibration step of the present invention is performed when the GC1 switches, having the logic $\phi$1D·GC1, are activated. VGC+ is sampled as input to the negative terminal of the integrator and VGC− is sampled into the positive terminal of the integrator 35. The output value D1 of the decimator is saved for the gain calculation. In the preferred embodiment, VGC+ is actually VREF+ and VGC− is VREF−, which is ground potential in this particular instance. However, calibration voltages other than VREF+ and VREF− can be utilized, if desired. Subsequently, the second gain calibration measurement is performed by closing switches having the activation logic $\phi$1D·GC2. This action reverses the input from VGC1, so that the output from the decimator corresponds to output D2. Then the calculation described above is performed to subtract D2 from D1, which result is then used to derive the gain scaling factor.

The timing of the activation of the various switches are noted in the FIG. 3. Switches having the notation $\phi$1 are activated during a first portion or phase of the sampling clock, $\phi$2 corresponds to activation during a second portion or phase. Typically, $\phi$2 is a non-overlapping complement of $\phi$1. The notations $\phi$1D and $\phi$2D denote time-delayed $\phi$1 and $\phi$2 signals. The delays are introduced to reduce errors caused by switch charge injection. Thus, notation $\phi$1D denotes that the activation of a $\phi$1D switch is determined by a slightly delayed signal $\phi$1. Similarly, $\phi$2D corresponds to a delayed signal $\phi$2.

Additionally, some of the switches are activated under predetermined conditions. More particularly, GC1 signifies the first gain calibration measurement, GC2 signifies the second gain calibration measurement, OC signifies offset calibration and NORMAL signifies normal operation. Furthermore, $\phi$2·B (and $\phi$2·B#) activations are determined by the bit value of the feedback signal from the output of the comparator stage of the $\Delta\Sigma$ modulator. When bit B has a value of 1 switches $\phi$2·B close. When bit B has a value of 0 (as noted by B#) switches $\phi$2·B# close (the # is noted by an overstrike line in the Figures).

It is appreciated that once this gain scaling factor is calculated, the gain correction (or gain scaling) value is stored in the ADC. In so doing, when the ADC is utilized under normal operation to process analog signals for conversion, the gain scaling factor adjusts the output to generate an accurate value of the input. Since the offset is nullified during gain calibration, either the offset calibration or gain calibration can be performed first. In the preferred technique, gain calibration is performed first.

FIG. 4 shows an alternative technique to the circuit of FIG. 3. In FIG. 4, the two pairs of sampling capacitor circuitry of FIG. 3 are combined in to a single pair, shown as switched capacitor network (or circuitry) 31*a* and 32*a*. Accordingly, the VREF+ and VREF− signals are now sampled through the input switched capacitor circuitry 31*a* and 32*a*, and under control of the feedback bit B. The resulting operation of circuit 40 is equivalent to the circuit 30 of FIG. 3. The offset and the two gain calibration measurements are made by the activations of the various switches noted in the Figure based on the switch logic described above, but are now combined with the sampling of the VREF+ and VREF− signals also at the same input. The advantage of the circuit of FIG. 4 over FIG. 3 is in the fewer number of components utilized to obtain the same result for the modulator stage.

Accordingly, either circuit example can be utilized to implement the gain calibration technique of the present invention. It is appreciated that other circuits can be readily implemented as well. The technique of the present invention removes the need for considering the variation of the offset error during gain calibration.

It is appreciated that the ADC 20 of the present invention can be utilized in a variety of ways and implemented in a variety of systems. For example, in FIG. 5 a signal processing system 50 is shown, which utilizes the ADC 20. A sensor unit 51 monitors a given environment and generates an analog signal in response to its sensing activity in receiving a stimulus. For example, the sensor unit 51 can be a hydrophone used for passive sonar applications. The sensor transmits analog information to the ADC 20. A pre-amplifier 52 is utilized in the particular example to boost the signal to the ADC 20.

Figure 5:
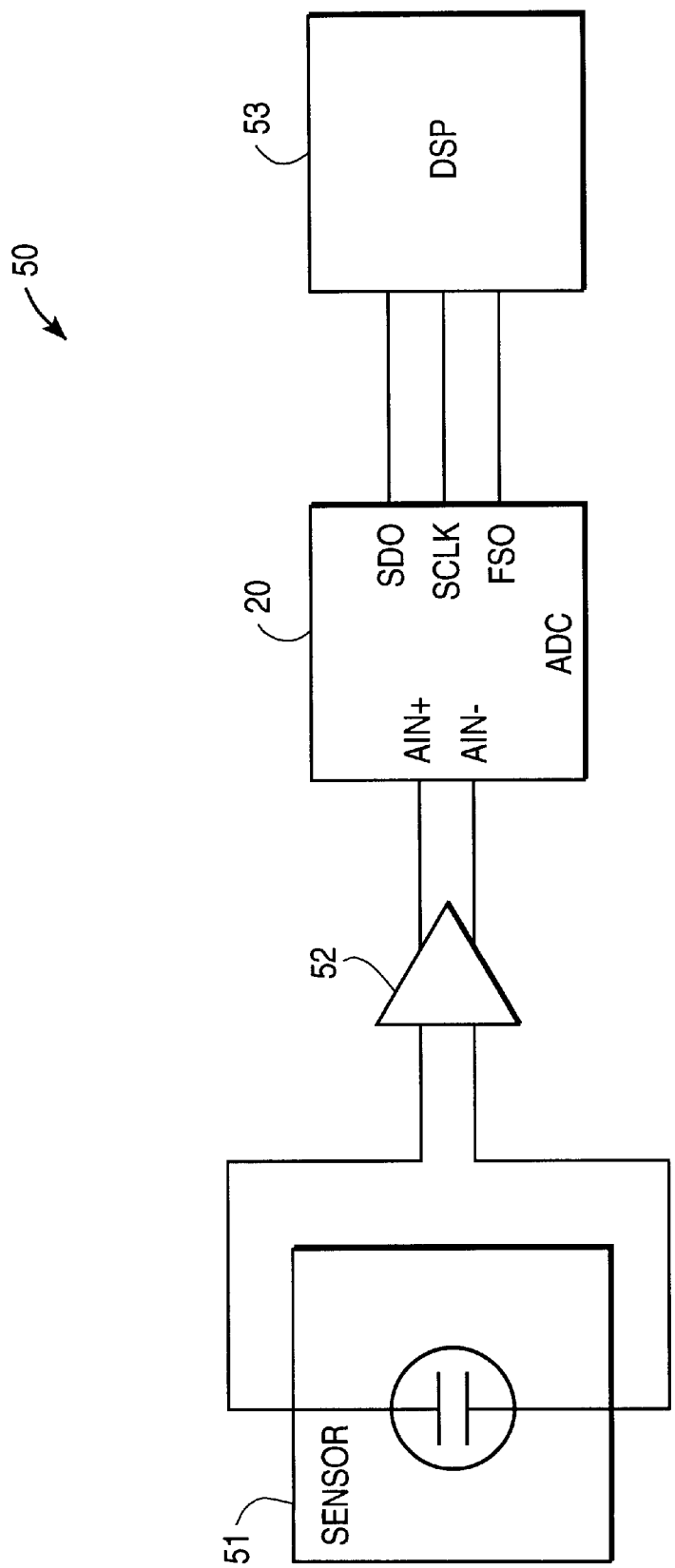
FIG. 5 shows one example of a system in which the analog-to-digital converter of the present invention is used to convert an analog signal from a sensor into a digital word for processing by a digital signal processor.

The analog signal is coupled as input to the ADC 20 at AIN+ and AIN− terminals. The SDO, SCLK and FSO outputs of the ADC 20 are then coupled to a digital signal processing unit 53 for processing the digital signal from the ADC 20. The DSP 53 can be of a variety of digital processing devices. The DSP 53 manipulates the digital information from the ADC 20, which digital information is the digital representation of the analog signal sent by the sensor 51. FIG. 5 is but just one example of how the ADC 20 implementing the present invention can be utilized.

Thus, it is appreciated that the practice of the present invention permits gain calibration to be performed on ADCs without the need to address the difference in common mode voltages and offset error variations resulting from poor common mode rejection. It is also appreciated that the invention works best when the common mode voltage is one of the dominant first-order effects in an ADC for determining the offset; all other factors influencing the offset to first-order are held relatively constant; and any difference in condition from one measurement to the second influence the offset only to the second-order.

We claim:

1. A method of performing gain calibration comprising:
   applying a calibration voltage as first calibration input to a differential data conversion stage;
   measuring a first digital value at the output of the stage;
   reversing the applying of the calibration voltage at the input to the stage;
   measuring a second digital value at the output of the stage based on the reversed input;

subtracting one output from the other to obtain a difference value and in which offset errors introduced in the stage by the applying of the calibration voltages are canceled;

utilizing the difference value to obtain a gain scaling factor.

2. The method of claim 1 further including the dividing of the difference value by two to obtain the gain scaling factor.

3. The method of claim 2 wherein said applying of the calibration voltages include applying the voltages from a single-ended source.

4. The method of claim 2 wherein said applying of the calibration voltages include applying the voltages to the data converter stage by switched capacitor sampling.

5. A method of performing gain calibration in an analog-to-digital converter, ADC, employing a differential modulation technique to sample and convert an analog input comprising:

applying a calibration voltage as first calibration input to the ADC;

measuring a first digital value, D1, at the output of the ADC, in which $$D1=S1+VO1,$$

where VO1 is an offset error;

reversing the applying of the calibration voltage at the input terminals of the ADC;

measuring a second digital value, D2, at the output based on the reversed input, in which $$D2=S2+VO2,$$

where VO2 is an offset error;

performing a subtraction operation to subtract one output from the other to obtain a difference value, wherein $$D1-D2=(S1+VO1)-(S2+VO2),$$

but wherein VO1=VO2 and S1=−S2 since only the polarity is reversed in the two calibration voltages, such that $$D1-D2=2S1,$$

in which offset errors introduced in the applying of the calibration voltages are canceled;

utilizing half the difference value to obtain a gain scaling factor S for determining the gain scaling.

6. The method of claim 5 wherein said applying of the calibration voltages include applying the voltages to the ADC which performs an oversampling type of modulation for the ADC.

7. The method of claim 6 wherein said applying of the calibration voltages include applying the voltages to a delta sigma modulation stage of the ADC.

8. The method of claim 7 wherein said applying of the calibration voltages include applying the voltages from a single-ended reference source.

9. The method of claim 5 wherein said applying of the calibration voltages include applying the voltages from a single-ended reference source.

10. An apparatus for performing gain calibration to obtain a gain scaling factor to adjust the gain of a data converter comprising:

a differential input stage for sampling an analog input, the analog input is converted to generate a corresponding digital output;

a voltage reference source coupled to differential input terminals of said differential input stage for providing a calibration voltage;

a switching network coupled to said voltage reference source, said switching network applying the calibration voltage as first calibration input to the differential input terminals to generate a first digital value at the output;

said switching network reversing the polarity of the calibration voltage at the input terminals to generate a second digital value at the output based on the reversed input;

said two digital outputs being subtracted one from the other to obtain a difference value and in which offset errors introduced in the application of the calibration voltages are canceled.

11. The apparatus of claim 10 wherein the differential input stage is comprised of a differential integrator.

12. The apparatus of claim 11 further including a switched capacitor circuit coupled at the input of the integrator stage to sample the analog input and wherein said switching network forms a part of said switched capacitor circuit.

13. The apparatus of claim 12 wherein said differential input stage is an input stage for an oversampling type modulator.

14. The apparatus of claim 13 wherein said oversampling type modulator is a delta sigma modulator.

15. An analog-to-digital converter, ADC, for sampling an analog input and converting the analog input to a corresponding digital output and in which gain calibration is performed to obtain a gain scaling factor to adjust the gain of the ADC comprising:

a modulator having a differential input stage for sampling the analog input;

a decimator coupled to receive output from the modulator and to generate the digital output;

a voltage reference source coupled to differential input terminals of the differential input stage for providing a calibration voltage;

a switching network coupled to said voltage reference source, said switching network applying the calibration voltage as first calibration input to the differential input terminals to generate a first digital value at the output of said decimator;

said switching network reversing the polarity of the calibration voltage at the input terminals to generate a second digital value at the output of said decimator based on the reversed input;

said two digital outputs when subtracted one from the other to obtain a difference value, cancels offset errors introduced in the application of the calibration voltages.

16. The apparatus of claim 15 wherein the differential input stage is comprised of a differential integrator.

17. The apparatus of claim 16 further including a switched capacitor circuit coupled at the input of the integrator stage to sample the analog input and wherein said switching network forms a part of said switched capacitor circuit.

18. The apparatus of claim 17 wherein said differential input stage is an input stage for an oversampling type modulator.

19. The apparatus of claim 18 wherein said oversampling type modulator is a delta sigma modulator.

20. An apparatus for receiving a stimulus, generating an analog signal and converting the analog signal for processing comprising:

a sensor for generating the analog signal in response to the stimulus;

an analog-to-digital converter, ADC, coupled to said sensor for sampling the analog signal as an input, converting the analog input to a corresponding digital output and in which gain calibration is performed to obtain a gain scaling factor to adjust the gain of the ADC comprising:
(a) a modulator having a differential input stage for sampling the analog input;
(b) a decimator coupled to receive output from the modulator and to generate the digital output;
(c) a voltage reference source coupled to differential input terminals of the differential input stage for providing a calibration voltage;
(d) a switching network coupled to said voltage reference source, said switching network applying the calibration voltage as first calibration input to the differential input terminals to generate a first digital value at the output of said decimator;
said switching network reversing the polarity of the calibration voltage at the input terminals to generate a second digital value at the output of said decimator based on the reversed input;
said two digital outputs when subtracted one from the other to obtain a difference value cancels offset errors introduced in the application of the calibration voltages.

21. The apparatus of claim 20 wherein the differential input stage is comprised of a differential integrator.

22. The apparatus of claim 21 further including a switched capacitor circuit coupled at the input of the integrator stage to sample the analog input and wherein said switching network forms a part of said switched capacitor circuit.

23. The apparatus of claim 22 wherein said differential input stage is an input stage for an oversampling type modulator.

24. The apparatus of claim 23 wherein said oversampling type modulator is a delta sigma modulator.

* * * * *